(12) United States Patent
Melvin, III

(10) Patent No.: US 7,451,068 B2
(45) Date of Patent: Nov. 11, 2008

(54) METHOD AND APPARATUS FOR GENERATING AN OPC SEGMENTATION BASED ON MODELED INTENSITY GRADIENTS

(75) Inventor: Lawrence S. Melvin, III, Hillsboro, OR (US)

(73) Assignee: Synopsys, Inc., Mountain View, CA (US)

( * ) Notice: Subject to any disclaimer, the term of this patent is extended or adjusted under 35 U.S.C. 154(b) by 657 days.

(21) Appl. No.: 10/683,534

(22) Filed: Oct. 10, 2003

(65) Prior Publication Data

US 2005/0081179 A1 Apr. 14, 2005

(51) Int. Cl.
G06F 17/50 (2006.01)
(52) U.S. Cl. .................. 703/14; 716/19; 716/21
(58) Field of Classification Search .................. 703/14; 716/2, 10, 11, 19, 21
See application file for complete search history.

(56) References Cited

U.S. PATENT DOCUMENTS

| | | | |
|---|---|---|---|
| 6,453,457 B1 * | 9/2002 | Pierrat et al. | 716/19 |
| 6,792,591 B2 * | 9/2004 | Shi et al. | 716/19 |
| 6,871,337 B2 * | 3/2005 | Socha | 716/19 |
| 6,978,438 B1 * | 12/2005 | Capodieci | 716/21 |
| 7,010,764 B2 * | 3/2006 | Pierrat | 716/4 |
| 7,024,655 B2 * | 4/2006 | Cobb | 716/19 |
| 7,043,712 B2 * | 5/2006 | Mukherjee et al. | 716/19 |
| 7,082,596 B2 * | 7/2006 | Liu | 716/19 |
| 7,124,394 B1 * | 10/2006 | Abrams et al. | 716/19 |
| 2003/0061587 A1 * | 3/2003 | Zhang et al. | 716/11 |

FOREIGN PATENT DOCUMENTS

WO WO 01/42964 A2 6/2001

OTHER PUBLICATIONS

Melvin III et al. (Model-based methodology for reducing OPC output pattern complexity, SPIE 2003).*
Fanget et al. (Adjustment of Optical Proximity Correction (OPC) Software for Mask Process Correction (MPC), Oct. 2001).*
Publication entitled "A Model-Based Methodology for Reducing OPC Output Pattern Complexity", by Lawrence S. Melvin III, Proceedings of SPIE, vol. 5256, 23$^{rd}$ Annual BACUS Symposium on Photomask Technology, XP-002367949, pp. 238-245.
Publication entitled "OPC Strategies to Minimize Mask Cost and Writing Time", by Michael L. Rieger, Proceedings of SPIE, vol. 4562, 21 st Annual BACUS Symposium on Photomask Technology, XP-002367949, pp. 154-160.
Internet Article entitled "Proteus, Progen, Prospector Full-Chip Optical Proximity Correction", Apr. 14, 2003, XP002367951,URL: http://web.archive.org/web/20030414050107/www.synopsys.com/products/avmrg/pdfs/proteus_ds.pdf.

* cited by examiner

*Primary Examiner*—Paul L Rodriguez
*Assistant Examiner*—Andre Pierre Louis
(74) *Attorney, Agent, or Firm*—Park, Vaughan & Fleming LLP

(57) ABSTRACT

One embodiment of the invention provides a system that dissects edges of a layout of an integrated circuit to produce a segmentation of the layout for a subsequent optical proximity correction (OPC) operation. In order to perform the dissection, the system first performs a model-based simulation on the layout to generate intensity gradients along edges of features in the layout. Next, the system generates a segmentation for edges in the layout based upon the intensity gradients. This segmentation is used during a subsequent optical proximity correction (OPC) process to generate corrections for the layout so that the layout prints more accurately on a semiconductor chip.

30 Claims, 8 Drawing Sheets

| Angle | Magnitude | Segment Length | Line End Choice |
|---|---|---|---|
| $89.5 \leq \theta \leq 90.5$ | $\delta$ | $\infty$ | - |
| $85 \leq \theta < 89.5$ and $90.5 < \theta \leq 95$ | $\delta$ | X nm | - |
| $\theta < 85$ and $95 < \theta$ | $\delta$ | Y nm | - |
| | $r < 0.0044$ $\delta$ | - | Dog Ears |
| | $r \geq 0.0044$ $\delta$ | - | Line Extension |

FIG. 8

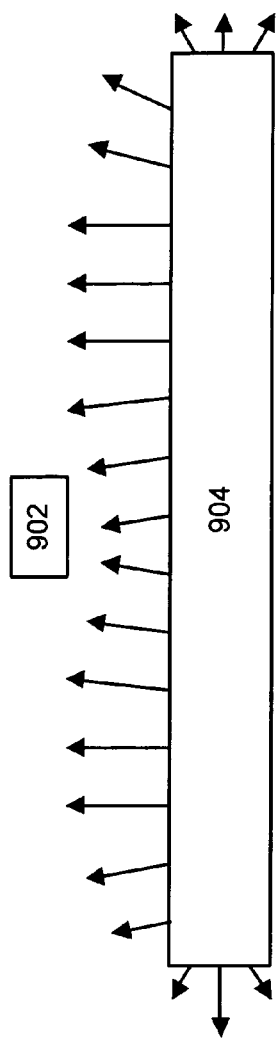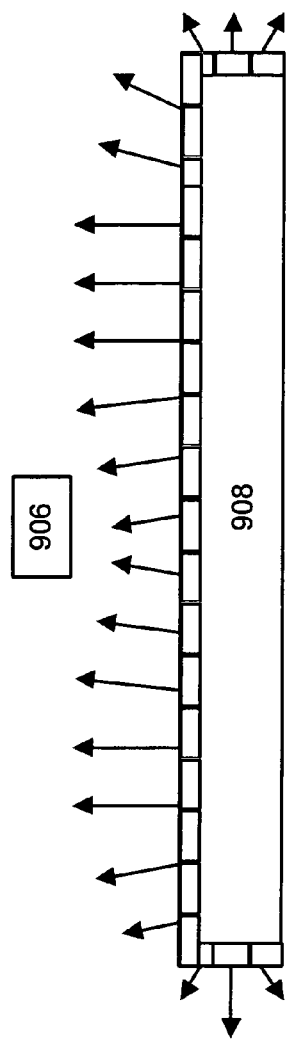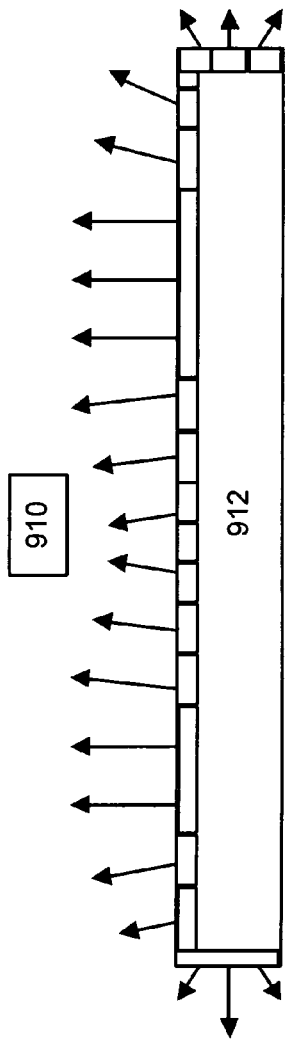

METHOD AND APPARATUS FOR GENERATING AN OPC SEGMENTATION BASED ON MODELED INTENSITY GRADIENTS

BACKGROUND

1. Field of the Invention

The invention relates to the process of designing and fabricating semiconductor chips. More specifically, the invention relates to a method and an apparatus for generating an optical proximity correction (OPC) segmentation based on modeled intensity gradients, wherein the OPC segmentation is used by an OPC process to generate corrections for the layout of an integrated circuit so that the layout prints more accurately on a semiconductor chip.

2. Related Art

As integration densities on a semiconductor chips continue to increase at an exponential rate, it is becoming progressively harder to deal with optical effects that arise during the optical lithography process involved in manufacturing the semiconductor chips. These optical effects can cause unwanted distortions in the printed layout that is generated by the optical lithography process.

To remedy this problem, a layout is often subjected to a model-based optical proximity correction (OPC) operation, which adjusts the layout to compensate for optical effects. (Although the term "optical proximity correction" is used in this specification, more generally the term as used herein refers to correction for any specified proximity effects, e.g. optical, micro-loading, etch, resist, etc.) These adjustments are made based upon results of model-based simulations of the printed layout. During this OPC operation, edges in the layout are divided into segments, and each segment is adjusted with a negative or a positive bias based upon a deviation between the desired layout and the simulated layout.

One of the most effective techniques to increase OPC correction accuracy is to reduce the length of the correction segment, thereby allowing finer manipulation units for the final correction. This approach leads to correction improvements, but also leads to data volume explosion and increases mask construction difficulties. These construction difficulties can lead to masks that cannot be inspected, and sometimes not even constructed. (Note that the term "mask" as used in this specification is meant to include the term "reticle.").

Current methodologies for determining OPC model-based segment sizes are based on worst-case correction scenarios, combined with rules that look at pattern placement to choose locations where larger than worst-case segment lengths may be used. These tools have been effective means of sampling and correcting patterns at 130 nm and above, but at 90 nm and below, some segment lengths need to be as small as 25% to 20% of the wavelength of the radiation (or light) used in the exposure of the mask to produce adequate process margin and correction, e.g. for $\lambda$=193 nm, this would imply ~38-49 nm segments. Segment lengths in these ranges can produce regions on the mask that cannot be inspected nor sometimes constructed. These mask construction issues effectively prevent the use of the very short segments necessary to make high-precision corrections.

Hence, what is needed is a method and an apparatus that facilitates using very short segment lengths without the above-described problems.

SUMMARY

One embodiment of the invention provides a system that facilitates dissecting a layout of an integrated circuit based on modeled intensity gradients to produce a segmentation for an optical proximity correction (OPC) process. During operation, the system performs a model-based simulation on the layout to generate intensity gradients along edges of features in the layout. The system also generates a segmentation for edges in the layout based upon the intensity gradients, wherein the segmentation is used by a subsequent OPC process in generating corrections for the layout.

In a variation on this embodiment, the system generates the segmentation for edges in the layout based upon the intensity gradients along the edges, and then uses the segment lengths to dissect the edges in the layout, thereby generating the segmentation for the layout.

In a variation on this embodiment, the system identifies a segment length for an edge by using a predetermined association to map an intensity gradient angle (and possibly magnitude) to the segment length.

In a variation on this embodiment, generating the segmentation involves selecting a segmentation for a line-end in the layout from a set of predetermined line-end segmentations based upon intensity gradients associated with the line-end. In a further variation, the segmentation for the line-end is selected based upon a magnitude (and possibly angle) of an intensity gradient associated with the line-end.

In a variation on this embodiment, the system performs the model-based simulation by dividing each edge in the layout into minimum-sized segments, and then performing a model-based simulation to determine an intensity gradient for each minimum-sized segment.

In a further variation, the system determines a gradient for a given minimum-sized segment by performing a model-based simulation at two tangential points along the segment to determine a tangential component of the gradient.

In a further variation, the system determines the gradient for the given minimum-sized segment by performing a model-based simulation at two points along a normal to the segment to determine a normal component of the gradient. Note that the gradient may also be determined through other methods. For example, a numerical gradient could be used that produces an instantaneous gradient rather than the average gradient. This has the advantage of only requiring one model evaluation per segment, so it is computationally cheaper.

In a variation on this embodiment, the system performs a subsequent dissection on problem areas in the layout after initial OPC operations take place. In addition to a subsequent dissection, the same subsequent evaluation can be used to merge segments that do not need as much correction once correction has commenced.

In a variation on this embodiment, prior to receiving the layout, the system calibrates the association between gradients and segment lengths by first modeling an intensity gradient across a test pattern, and then identifying target regions in the test pattern that have a large amount of correction shift variation. Next, the system maps intensity gradients to the target regions, and associates segment lengths with the target regions. The system then produces an association between intensity gradients and segment lengths in the target regions, whereby the association is subsequently used in generating the segmentation for the layout.

Therefore, rather than placing small segments everywhere on the mask, the above-described process uses gradient information to place small segments only where required.

Medium-length and longer-length segments are placed in regions where the process already has adequate margin. This placement allows the difficult correction areas to use shorter segments while maintaining or reducing data volume by using longer segments in simpler areas.

The above-described technique leverages pre-correction process simulation to predict the most "cost-effective" shape for a feature. With simulated pattern characteristics and with consideration of potential mask rule violations, the method can establish an optimum correction shape "format." For example, the choice between various line-end-treatments can be determined up front, thus focusing the OPC computation on the most effective and least complex shape, and dispensing with the need to perform post-OPC mask constraint shape adjustments. This implementation of this methodology leads to a more frugal correction that maintains correction accuracy while reducing mask construction complexity.

BRIEF DESCRIPTION OF THE FIGURES

FIG. 8 presents an exemplary table that maps gradients to segment lengths in accordance with an embodiment of the invention.

FIG. 9A illustrates an exemplary set of intensity gradients in accordance with an embodiment of the invention.

FIG. 9B illustrates uniform segments used in current correction/dissection methodologies.

FIG. 9C illustrates model-based segment sizing based on intensity gradients in accordance with an embodiment of the invention.

DETAILED DESCRIPTION

Figure 1:
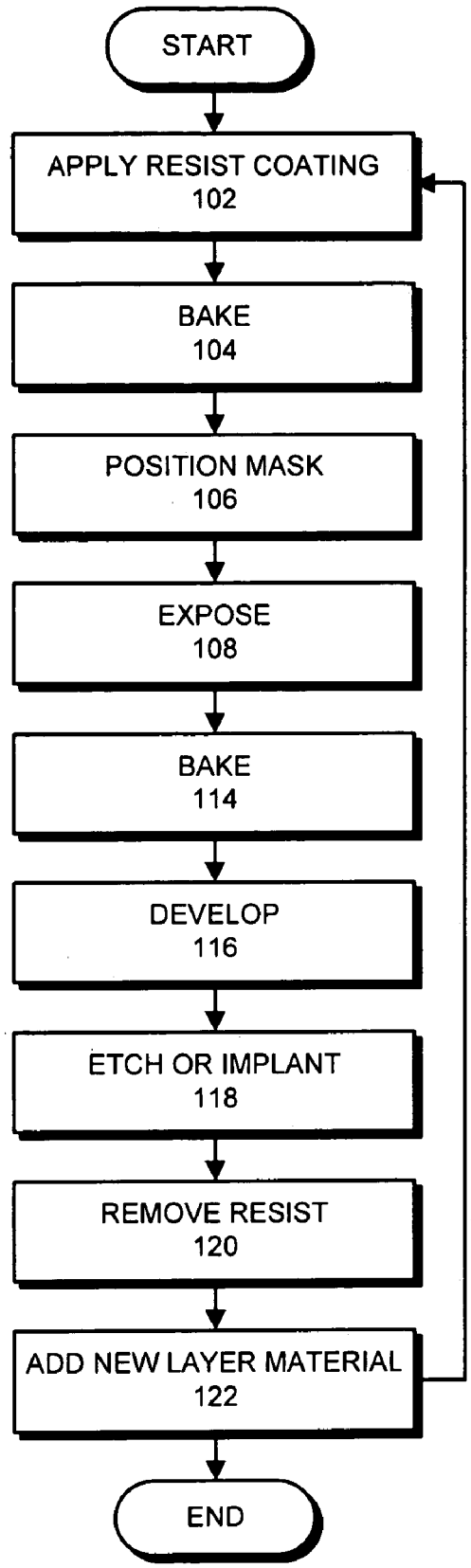
FIG. 1 is a flow chart illustrating the wafer fabrication process in accordance with an embodiment of the invention.

The masks described in this specification are used during the process of manufacturing an integrated circuit. More specifically, FIG. 1 presents a flow chart illustrating the wafer fabrication process in accordance with an embodiment of the invention. The system starts by applying a photoresist layer to the top surface of a wafer (step 102). Next, the system bakes the photoresist layer (step 104). The system then positions a mask over the photoresist layer (step 106), and exposes the photoresist layer through the mask (step 108). In some embodiments, multiple masks and/or exposures may be used in steps 106 and 108. Next, the system optionally bakes the wafer again (step 114) before developing the photoresist layer (step 116). Next, either a chemical etching or ion implantation step takes place (step 118) before the photoresist layer is removed (step 120). (Note that in the case of a lift-off process, a deposition can take place.) Finally, a new layer of material can be added and the process can be repeated for the new layer (step 122).

Design Process

Figure 2:
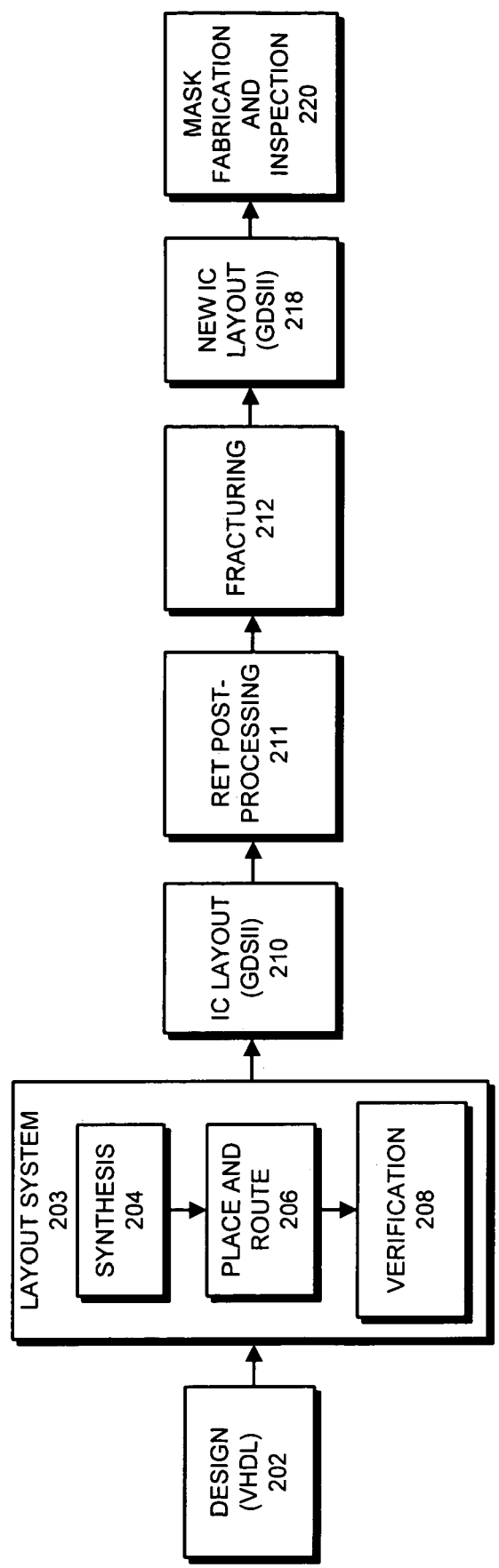
FIG. 2 illustrates the process of creating a mask to be used in fabricating an integrated circuit in accordance with an embodiment of the invention.

FIG. 2 illustrates the process of creating a mask to be used in the wafer fabrication process described above in accordance with an embodiment of the invention. The process starts when a circuit designer produces a design 202 in VHDL, or some other hardware description language. VHDL is an acronym for VHSIC Hardware Description Language. (VHSIC is a Department of Defense acronym that stands for very high-speed integrated circuits.) The VHDL standard has been codified in Institute for Electrical and Electronic Engineers (IEEE) standard 1076-1993.

Design 202 then feeds through a layout system 203 that performs a number of functions, such as synthesis 204, placement and routing 206 and verification 208. The result is an integrated circuit (IC) layout 210, which is in the form of a specification expressed in a format such as the hierarchical GDSII format.

IC layout 210 then passes into RET post-processing system 211, which can perform resolution enhancement techniques (RETs) to facilitate printing of the IC layout 210 on the finished wafer. At step 211, the IC layout 210 can be processed for RET such as phase shifting (e.g. alternating aperture dark field phase shifting) followed by OPC to compensate for proximity effects that arise during the wafer production process.

The output of RET post-processing system 211 feeds into fracturing process 212, which fractures the layout for subsequent mask-writing operations. This can be accomplished using any one of a number of well-known mask fracturing techniques.

The output of fracturing process 212 is a new IC layout 218. New IC layout 218 subsequently passes into mask fabrication and inspection processes 220. Probably should include fracture after RET and before fabrication, because this is one of the places this invention improves manufacturing.

Process of Generating a Mask

Figure 3:
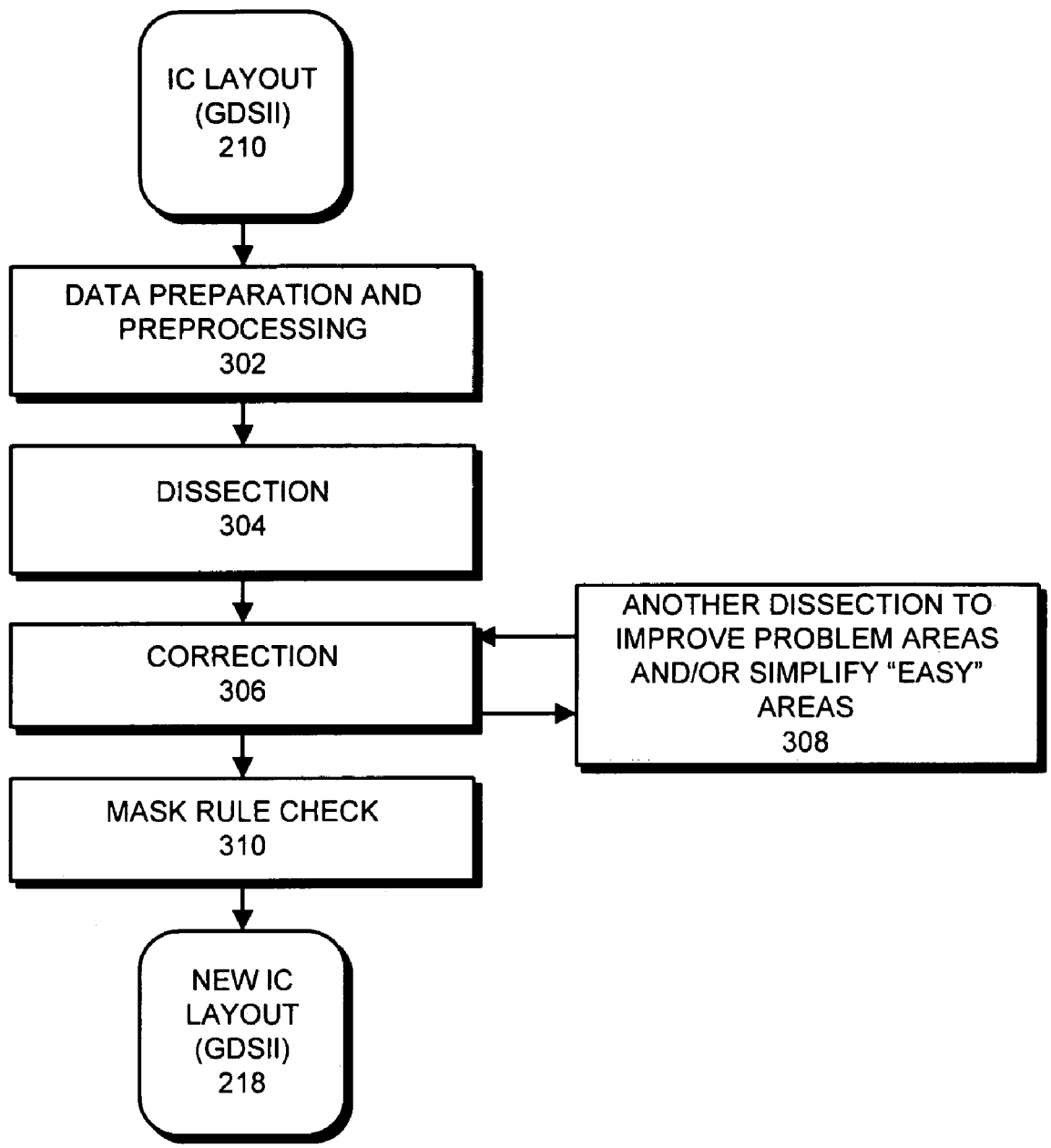
FIG. 3 illustrates the process of correcting a layout for an integrated circuit in accordance with an embodiment of the invention.

FIG. 3 illustrates the process of generating a mask to be used in fabricating an integrated circuit in accordance with an embodiment of the invention. This flow chart describes in more detail the operations performed during step 210 of the flow chart illustrated in FIG. 2.

Referring to FIG. 2, the system starts with an IC layout 210 in GDSII format, and performs data preparation and preprocessing operations on the layout, which can include various operations, such as applying biases and identifying gates (step 302). Next, the system performs a dissection operation to divide figures in the layout into segments for OPC purposes (step 304).

Once the segmentation is complete, the system performs the OPC operation on the segmented layout (step 306). If necessary, the system performs an additional dissection on "problem areas" in the layout that are not converging properly during the OPC process (step 308). The additional dissection can also involve reducing the number of segments in areas that prove to be simpler to correct than predicted.

Note that in some cases after a few iterations of the OPC process, it becomes apparent that certain problem areas in the layout are not converging fast enough to produce an acceptable correction. In these cases, instead of continuing to perform OPC iterations with little or no gain, it is preferable to perform an additional segmentation (possibly using different segmentation parameters) on the problem areas to generate a new segmentation. With this new segmentation, subsequent OPC operations are more likely to make progress.

Finally, the system performs a mask rule check (MRC) operation to verify that the mask adheres to design rules before generating the new IC layout 218 (step 310).

Generating a Segmentation Using Model-Based Intensity Gradients

Figure 4A:
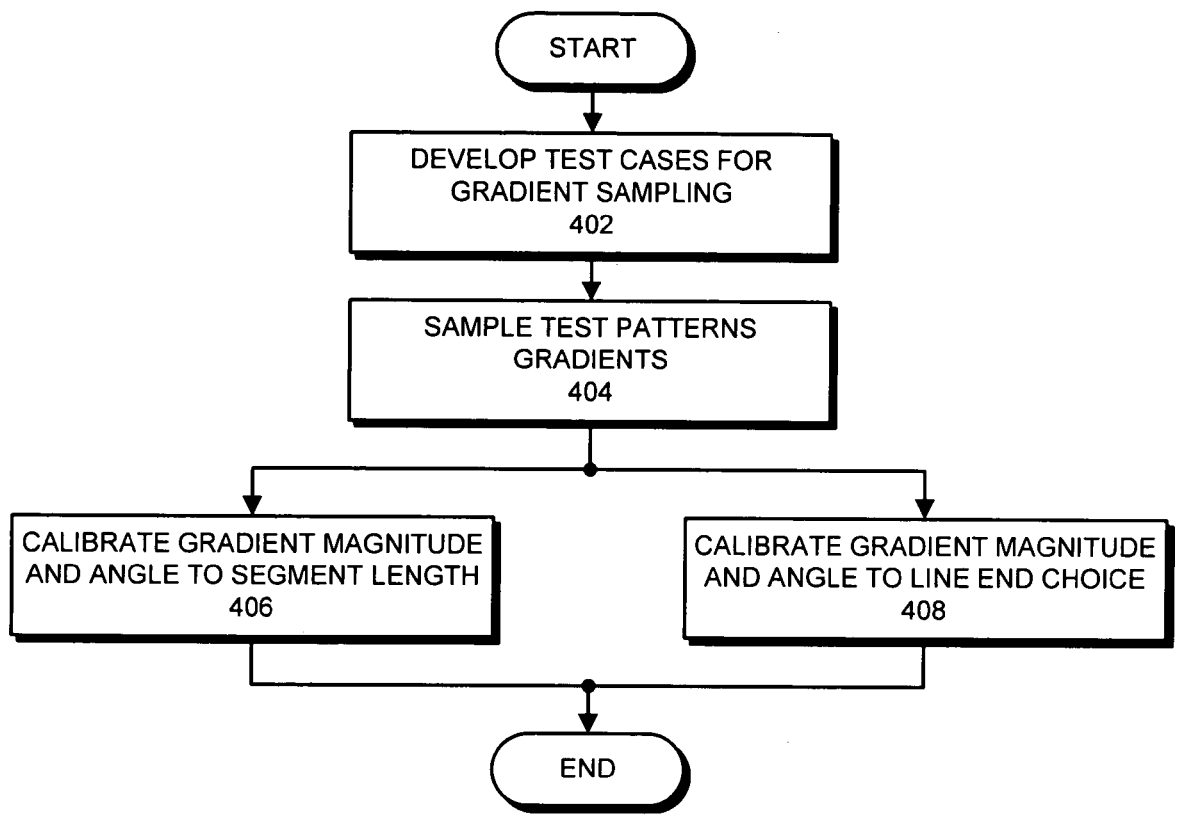
FIG. 4A presents a flow chart illustrating how modeled intensity gradients are used to generate a segmentation in accordance with an embodiment of the invention.

FIG. 4A presents a flow chart illustrating how modeled intensity gradients are used in generating a segmentation in accordance with an embodiment of the invention. This flow chart describes in more detail the operations performed during step 211 of the flow chart illustrated in FIG. 2. The segmentations are in turn used during the dissection step 304 illustrated in FIG. 3.

By examining the modeled intensity gradient across a pattern, a calibrated choice of segment length can be made for any gradient value. This process involves creating test sets comprised of optically significant but varying patterns, and then studying the gradient characteristics of the various features.

The first step in this process is to develop an adequate test case to understand the implications of varying gradients (step 402). Note that the test set needs to include areas with known varying optical properties, but need not be particularly large.

Once a test set has been developed, gradient values for a specific model may be explored. An understanding of gradient characteristics is obtained by sampling the gradient's angle and magnitude at various locations through out the test set (step 404). To do this, a fine sampling of the gradient along all edges of all the test polygons is performed at a sampling frequency of 50 nm or smaller.

Figure 4B:
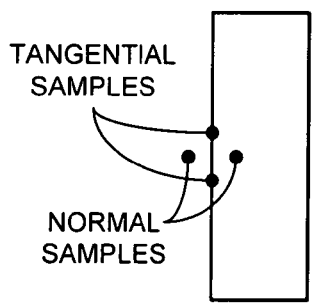
FIG. 4B illustrates how a gradient is sampled in accordance with an embodiment of the invention.
Figure 4C:
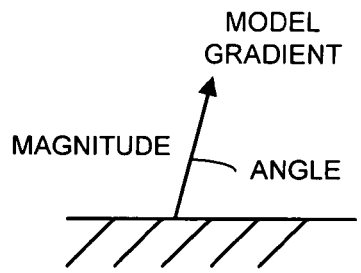
FIG. 4C illustrates an exemplary gradient in accordance with an embodiment of the invention.

For example, referring to FIG. 4B, a single gradient can be determined by taking four samples. Two of these samples are taken at tangential points along the edge, while the two other samples are taken along a normal to the edge. These four samples are used to compute tangential and normal components of the intensity gradient, which are combined to form the intensity gradient, which can be specified by a magnitude and an angle. Also note that it is possible to take fewer samples or more than four samples to determine a gradient. The output magnitude and angle are then correlated to correction complexity by investigating the sample segment movement when the test set is corrected in an unconstrained fashion using the model. (Note a number of different ways to sample a gradient are commonly known, so the above-described technique is just an example of one method.)

Figure 7:
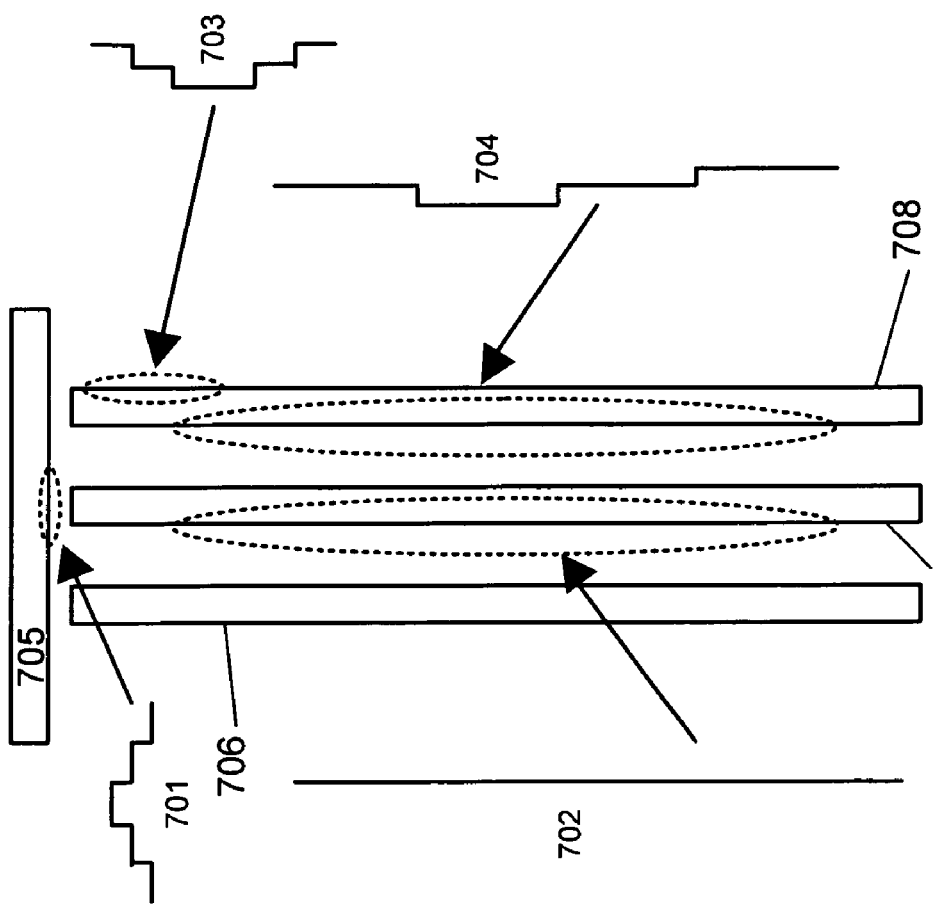
FIG. 7 illustrates a dissection test set example in accordance with an embodiment of the invention.

A pattern emerges where some correction regions have more correction shift variation than others. FIG. 7 illustrates this concept, where area 701 of feature 705 has a correction shift variation between each sampled segment and area 702 of feature 707 has no correction shift variation between segments. The areas with a greater number of shifts need finer (smaller) correction segments, while those with small or no correction shifts between segments can have infinitely long segments. Once these regions are identified, the gradient angle and magnitude data can be mapped to them. This mapping can be used to calibrate a gradient angle to a segment length (step 406). It can also be used to calibrate a gradient magnitude to a choice of a specific segmentation for a line-end (step 408).

After the gradient has been calibrated against segment length and line-end choice, the system can use the calibrated segment lengths and line-end choices while performing the dissection operations discussed above with respect to steps 304 and 308 of FIG. 3.

Figure 5:
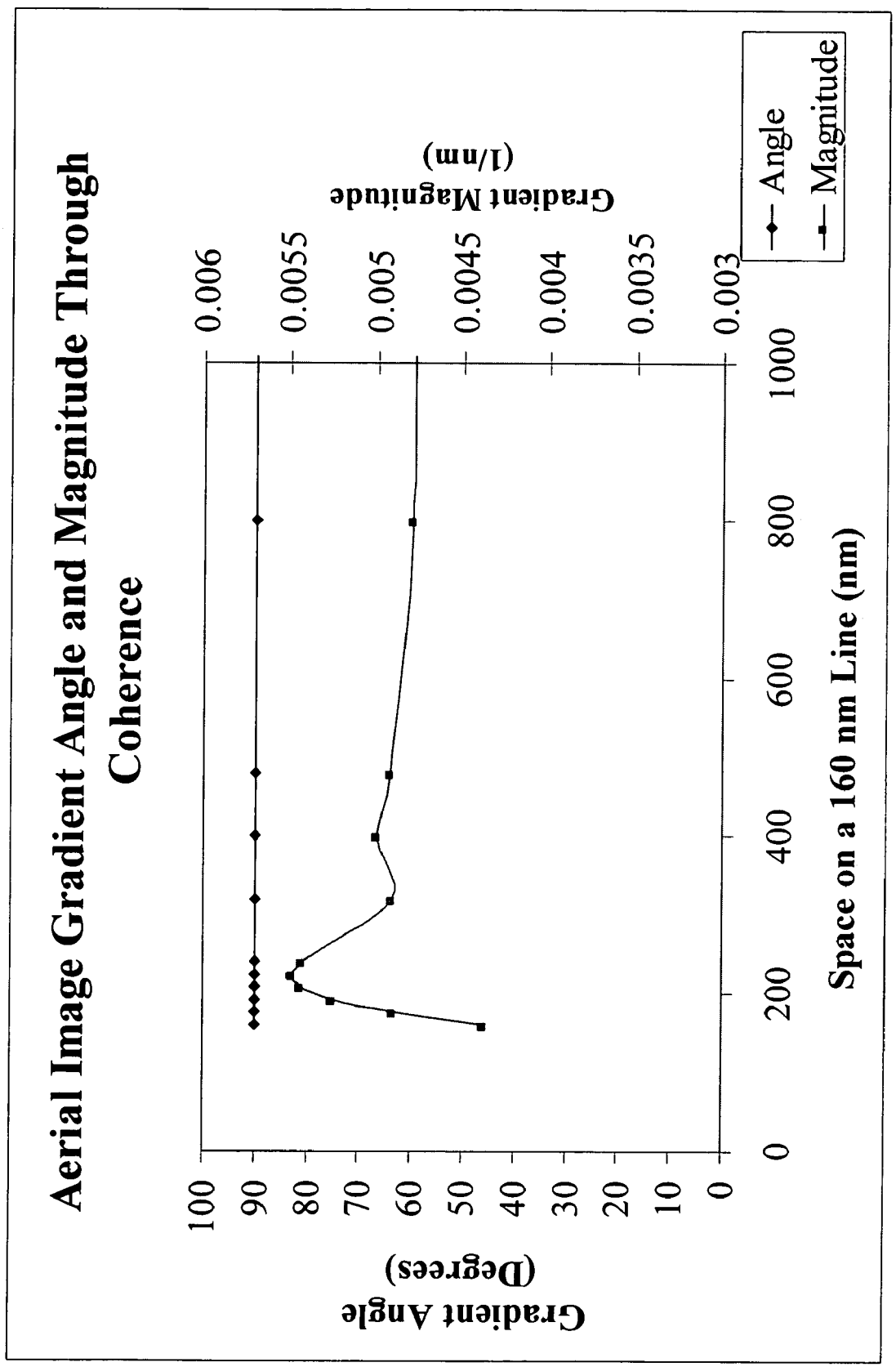
FIG. 5 presents a graph of gradient coherence in accordance with an embodiment of the invention.

Note that in step 406 above, the segmentation regions can be defined based on the gradient angle only. FIG. 5 presents a plot of gradient angle and magnitude versus pitch for the middle segment of a nested 4800 nm line. This is a one dimensional correction (1D) correction region that has special properties. The plot exhibits no tangential slope component, but is comprised of significant normal slope variation, which results in a constant ~90° angle but a varying magnitude. The magnitude appears to be sensitive to coherence effects. However, even though the gradient magnitude is varying with coherence, a series of nested segments at a distance greater than ambit from any two-dimensional feature will have the same correction shift within error for a given pitch. Therefore, the information necessary to make segmentation choices is completely contained within the gradient angle for one dimensional correction regions. This indicates that shorter correction segments are necessary as more tangential gradient component relative to the normal gradient component is present on a segment. As two dimensional features are dissected, the angle and magnitude may be used together to decide dissection lengths.

Figure 6B:
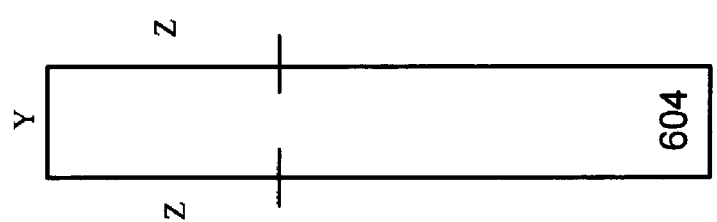
FIG. 6B illustrates a line-end segmentation for a line-extension correction in accordance with an embodiment of the invention.
Figure 6A:
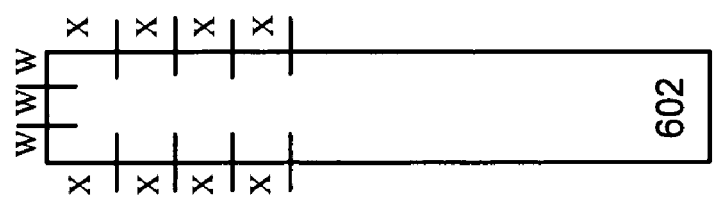
FIG. 6A illustrates a line-end segmentation for a dog-ear serif correction in accordance with an embodiment of the invention.

A similar process can be used for selecting a pre-defined segmentation for a line-end. For example, the system can select between a line extension correction and a dog-ear serif correction. The two correction features are illustrated in FIGS. 6A and 6B. As is illustrated in FIG. 6A, a dog-ear serif correction divides the line-end of line feature 602 into three correction segments of length W nm, and also divides the adjacent edges into short segments designated by run length of X nm. As is illustrated in FIG. 6B, a line-end extension correction on line 604 uses a single segment of length Y nm on the line-end, and Z m segments on the edges adjacent to the line-end. When properly placed, there is little correction performance difference between the two features, but a significant segment count reduction when using the line-extension correction. Note that the segment lengths W, X, Y and Z can be varied based on design, desire, and process.

In order to select a line-end segmentation, a gradient magnitude at the line-end center can be used. During the process of selecting a line-end segmentation, coherence is relevant to the type of structure used during correction. The gradient magnitude for an isolated long line can be used to determine the trigger point for a change between a line-extension correction and a dog-ear serif correction. Note that the isolated line case is a low mask error enhancement factor (MEEF) case where a correction such as a line-extension should perform well. Also, note that there are instances where gradient angle and magnitude may be used at the same time, especially in 2D areas.

The dissection test set example in FIG. 7 illustrates the process for mapping gradient angles to dissection length requirements. Exemplary results of this effort are presented in the table which appears in FIG. 8. In particular, FIG. 7 illustrates a pattern prior to correction, with post-correction edge wire frame diagrams of features 705-708. The area highlighted in region 701 of feature 705 has large correction shifts applied to each correction and inspection of the gradient angles reveals angles from 45 to 75 degrees and 105 and 135 degrees. The correction in area 702 of feature 707 contrasts with that in area 701, revealing almost no variation in the correction shift applied over the regions. When the gradient angle is checked over this region, it is found to move between approximately 90.1 and 89.9 degrees. (Note, the angle values in these examples may change based on need and are only illustrative.)

Areas 703 and 704 on feature 708 are more marginal cases, where the potential for some longer segments exist, but variation is necessary to produce an adequate correction. In area 704, the gradient angle varied from 85 to 95 degrees and the segments had small correction changes over several segments. In area 703, the gradient angle was between 80 and 100 degrees, but it had significantly more correction shifts than were present in area 704. Therefore, area 703 angles were binned with area 701 angles, but area 704 was binned into its own angle region with an intermediate segment length.

Once this lookup table (FIG. 8) is generated, it can then be refined during the correction process itself. For example, the exact transition values and segment lengths (X and Y) can be modified to refine the bin choices for specific patterns.

In one embodiment of the invention, during correction, the model-based dissection correction used in this example only performs model-based dissection on external line-end segments and one-dimensional correction segments. All other segments can be dissected using rules identical to those used for the rule-based dissection correction. The dissection length refers to the length of a single one-dimensional correction segment in rule-based dissection and the smallest possible correction segment in model-based dissection. (Note that in general segments can be dissected using model-based dissection, or a mix-and-match approach as discussed above.)

A model-based dissection produces significantly different results than a rules-based dissection. For example, FIGS. 9A-9C compare results of a model-based dissection against a rules-based dissection for the feature edge in accordance with an embodiment of the invention. FIG. 9A presents results of an initial gradient data-gathering step on feature 904 with vectors plotted at sampling points on the feature edge facing feature 902. FIG. 9B illustrates a segmentation of the feature edge of feature 908 facing feature 906, which uses rule-based dissection. In contrast, FIG. 9C illustrates model-based segment sizing of the feature edge of feature 912 facing feature 910 based upon intensity gradients in accordance with an embodiment of the invention. Note that the area with large angular deflections receives shorter segments, while those with perpendicular vectors are merged into one segment.

CONCLUSION

The foregoing description is presented to enable one to make and use the invention, and is provided in the context of a particular application and its requirements. It is not intended to be exhaustive or to limit the invention to the forms disclosed. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein. Accordingly, many modifications and variations will be apparent. The scope of the invention is defined by the appended claims.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet. In some embodiments, the electromagnetic wave form includes one or more of the Proteus™ and iN-Tandem™ software programs, both from Synopsys, Inc., Mountain View, Calif.

Note that the invention can be applied to any type of lithographic process for fabricating semiconductor chips, including processes that make use of, deep-ultraviolet (DUV) radiation, extreme ultraviolet (EUV) radiation, X-rays, and electron beams, along with suitably modified masks.

Moreover, note that the invention is not restricted to specific types of OPC, but can be generally applied to features related to a number of different correction or enhancement techniques, such as techniques that use phase shifting masks (PSM).

What is claimed is:

1. A method for dissecting a layout of an integrated circuit based on modeled intensity gradients to produce a segmentation for an optical proximity correction (OPC) process, comprising:
   calibrating the association between gradients and segment lengths by:
      modeling an intensity gradient including angle and magnitude across a test pattern;
      identifying target regions in the test pattern that have a large amount of correction shift variation;
      mapping intensity gradients including angles and magnitudes to the target regions;
      associating segment lengths with the target regions; and
      producing an association between intensity gradients including angles and magnitudes and segment lengths in the target regions, whereby the association is subsequently used in generating the segmentation for the layout;
   receiving the layout for the integrated circuit;
   performing a model-based simulation on the layout to generate 2-D intensity gradients along edges of features in the layout, wherein the 2-D intensity gradients include both magnitude and angle of the intensity change, and wherein an intensity gradient angle can be in any direction with respect to an edge; and
   generating a segmentation for edges in the layout based upon the 2-D intensity gradients, wherein the segmentation is used by a subsequent OPC process in generating corrections for the layout;
   wherein the OPC corrected layout is used to generate a mask for fabricating an integrated circuit.

2. The method of claim 1, wherein generating the segmentation involves:
   determining segment lengths for edges in the layout based upon the intensity gradients along the edges; and
   using the segment lengths to dissect the edges in the layout, thereby generating the segmentation for the layout.

3. The method of claim 2, wherein identifying a segment length for an edge involves using a predetermined association to map an intensity gradient angle to the segment length.

4. The method of claim 1, wherein generating the segmentation involves selecting a segmentation for a line-end in the layout from a set of predetermined line-end segmentations based upon intensity gradients associated with the line-end.

5. The method of claim 4, wherein the segmentation for the line-end is selected based upon a magnitude of an intensity gradient associated with the line-end.

6. The method of claim 1, wherein performing the model-based simulation on the layout involves:
dividing each edge in the layout into minimum-sized segments; and
performing a model-based simulation to determine an intensity gradient for each minimum-sized segment.

7. The method of claim 6, wherein determining a gradient for a given minimum-sized segment involves performing a model-based simulation at two tangential points along the segment to determine a tangential component of the gradient.

8. The method of claim 7, wherein determining the gradient for the given minimum-sized segment involves performing a model-based simulation at two points along a normal to the segment to determine a normal component of the gradient.

9. The method of claim 1, further comprising performing the dissection again on problem areas in the layout after initial OPC operations take place.

10. The method of claim 1, further comprising reducing the number of segments in areas that prove to be simpler to correct than predicted after initial OPC operations take place.

11. A computer-readable storage medium storing instructions that when executed by a computer cause the computer to perform a method for dissecting a layout of an integrated circuit based on modeled intensity gradients to produce a segmentation for an optical proximity correction (OPC) process, the method comprising:
calibrating the association between gradients and segment lengths by;
modeling an intensity gradient including angle and magnitude across a test pattern;
identifying target regions in the test pattern that have a large amount of correction shift variation;
mapping intensity gradients including angles and magnitudes to the target regions;
associating segment lengths with the target regions; and
producing an association between intensity gradients including angles and magnitudes and segment lengths in the target regions, whereby the association is subsequently used in generating the segmentation for the layout;
receiving the layout for the integrated circuit;
performing a model-based simulation on the layout to generate 2-D intensity gradients along edges of features in the layout wherein the 2-D intensity gradients include both magnitude and angle of the intensity change, and wherein an intensity gradient angle can be in any direction with respect to an edge; and
generating a segmentation for edges in the layout based upon the 2-D intensity gradients, wherein the segmentation is used by a subsequent OPC process in generating corrections for the layout;
wherein the OPC corrected layout is used to generate a mask for fabricating an integrated circuit.

12. The computer-readable storage medium of claim 11, wherein generating the segmentation involves:
determining segment lengths for edges in the layout based upon the intensity gradients along the edges; and
using the segment lengths to dissect the edges in the layout, thereby generating the segmentation for the layout.

13. The computer-readable storage medium of claim 12, wherein identifying a segment length for an edge involves using a predetermined association to map an intensity gradient angle to the segment length.

14. The computer-readable storage medium of claim 11, wherein generating the segmentation involves selecting a segmentation for a line-end in the layout from a set of predetermined line-end segmentations based upon intensity gradients associated with the line-end.

15. The computer-readable storage medium of claim 14, wherein the segmentation for the line-end is selected based upon a magnitude of an intensity gradient associated with the line-end.

16. The computer-readable storage medium of claim 11, wherein performing the model-based simulation on the layout involves:
dividing each edge in the layout into minimum-sized segments; and
performing a model-based simulation to determine an intensity gradient for each minimum-sized segment.

17. The computer-readable storage medium of claim 16, wherein determining a gradient for a given minimum-sized segment involves performing a model-based simulation at two tangential points along the segment to determine a tangential component of the gradient.

18. The computer-readable storage medium of claim 17, wherein determining the gradient for the given minimum-sized segment involves performing a model-based simulation at two points along a normal to the segment to determine a normal component of the gradient.

19. The computer-readable storage medium of claim 11, wherein the method further comprises performing the dissection again on problem areas in the layout after initial OPC operations take place.

20. The computer-readable storage medium of claim 11, further comprising reducing the number of segments in areas that prove to be simpler to correct than predicted after initial OPC operations take place.

21. An apparatus that dissects a layout of an integrated circuit based on modeled intensity gradients to produce a segmentation for an optical proximity correction (OPC) process, comprising:
a calibrating mechanism configured to calibrate the association between gradients and segment lengths by:
modeling an intensity gradient including angle and magnitude across a test pattern;
identifying target regions in the test pattern that have a large amount of correction shift variation;
mapping intensity gradients including angles and magnitudes to the target regions;
associating segment lengths with the target regions; and
producing an association between intensity gradients including angles and magnitudes and segment lengths in the target regions, whereby the association is subsequently used in generating the segmentation for the layout;
a receiving mechanism configured to receive the layout for the integrated circuit;
a model-based simulator configured to perform a model-based simulation on the layout to generate 2-D intensity gradients along edges of features in the layout, wherein the 2-D intensity gradients include both magnitude and angle of the intensity change, and wherein an intensity gradient angle can be in any direction with respect to an edge; and
a segmentation mechanism configured to generate a segmentation for edges in the layout based upon the 2-D intensity gradients, wherein the segmentation is used by a subsequent OPC process in generating corrections for the layout;

wherein the OPC corrected layout is used to generate a mask for fabricating an integrated circuit.

22. The apparatus of claim 21, wherein the segmentation mechanism is configured to:
determine segment lengths for edges in the layout based upon the intensity gradients along the edges; and to
use the segment lengths to dissect the edges in the layout, thereby generating the segmentation for the layout.

23. The apparatus of claim 22, wherein while identifying a segment length for an edge, the segmentation mechanism is configured to use a predetermined association to map an intensity gradient angle to the segment length.

24. The apparatus of claim 21, wherein the segmentation mechanism is configured to select a segmentation for a line-end in the layout from a set of predetermined line-end segmentations based upon intensity gradients associated with the line-end.

25. The apparatus of claim 24, wherein the segmentation mechanism is configured to select the segmentation for the line-end is selected based upon a magnitude of an intensity gradient associated with the line-end.

26. The apparatus of claim 21, wherein the model-based simulator is configured to:
divide each edge in the layout into minimum-sized segments; and to
perform the model-based simulation to determine an intensity gradient for each minimum-sized segment.

27. The apparatus of claim 26, wherein while determining a gradient for a given minimum-sized segment, the model-based simulator is configured to perform a model-based simulation at two tangential points along the segment to determine a tangential component of the gradient.

28. The apparatus of claim 27, wherein while determining the gradient for the given minimum-sized segment, the model-based simulator is configured to perform a model-based simulation at two points along a normal to the segment to determine a normal component of the gradient.

29. The apparatus of claim 21, wherein the segmentation mechanism is configured to perform the dissection again on problem areas in the layout after initial OPC operations take place.

30. The apparatus of claim 21, wherein the segmentation mechanism is configured to reduce the number of segments in areas that prove to be simpler to correct than predicted after initial OPC operations take place.

* * * * *